United States Patent
Tanaka et al.

(10) Patent No.: US 9,188,480 B2
(45) Date of Patent: Nov. 17, 2015

(54) COLOR FILTER ARRAY AND IMAGE SENSOR

(71) Applicants: TOKYO INSTITUTE OF TECHNOLOGY, Tokyo (JP); OLYMPUS CORPORATION, Tokyo (JP)

(72) Inventors: Masayuki Tanaka, Tokyo (JP); Yusuke Monno, Tokyo (JP); Masatoshi Okutomi, Tokyo (JP); Sunao Kikuchi, Tokyo (JP); Yasuhiro Komiya, Tokyo (JP)

(73) Assignees: OLYMPUS CORPORATION, Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 205 days.

(21) Appl. No.: 14/068,151

(22) Filed: Oct. 31, 2013

(65) Prior Publication Data

US 2014/0054448 A1    Feb. 27, 2014

Related U.S. Application Data

(63) Continuation of application No. PCT/JP2012/003069, filed on May 10, 2012.

(30) Foreign Application Priority Data

May 11, 2011    (JP) .................. 2011-106740

(51) Int. Cl.
*G02B 5/20* (2006.01)
*G01J 1/04* (2006.01)
*H01L 27/146* (2006.01)
*H04N 9/04* (2006.01)

(52) U.S. Cl.
CPC ............... *G01J 1/0492* (2013.01); *G02B 5/201* (2013.01); *H01L 27/14621* (2013.01); *H01L 27/14625* (2013.01); *H01L 27/14643* (2013.01); *H04N 9/045* (2013.01); *H01L 27/14645* (2013.01)

(58) Field of Classification Search
CPC . G02B 5/201; G01J 1/0492; H01L 27/14621; H01L 27/14625; H01L 27/14643; H01L 27/14645; H04N 9/045
USPC ................. 250/208.1, 226; 359/891
See application file for complete search history.

(56) References Cited

U.S. PATENT DOCUMENTS

| | | | | |
|---|---|---|---|---|
| 7,745,779 | B2* | 6/2010 | Conners .................... | 250/226 |
| 7,855,740 | B2* | 12/2010 | Hamilton et al. .......... | 348/273 |
| 2009/0021612 | A1* | 1/2009 | Hamilton et al. .......... | 348/249 |
| 2009/0200451 | A1* | 8/2009 | Conners .................... | 250/208.1 |

FOREIGN PATENT DOCUMENTS

| | | |
|---|---|---|
| JP | 2003-087806 A | 3/2003 |
| JP | 2009-284010 A | 12/2009 |
| JP | 2009-290607 A | 12/2009 |

OTHER PUBLICATIONS

International Search Report dated Aug. 7, 2012 issued in PCT/JP2012/003069.

* cited by examiner

*Primary Examiner* — Seung C Sohn
(74) *Attorney, Agent, or Firm* — Scully, Scott, Murphy & Presser, P.C.

(57) ABSTRACT

The color filter array 21a comprises seven or more types of color filters including a first color filter. The seven or more types color filters have different spectral sensitivity characteristics. The seven or more types of color filters are arranged in a two-dimensional form. Among the seven or more types of color filters, at least two types of color filters are designated as a color filter of interest. Two color filters arranged at a first interval on both sides of the color filter of interest along a first direction are of the same type. Two color filters arranged at a second interval on both sides of the color filter of interest along a second direction that is different from the first direction are of the same type. Among the color filters, at least one type of color filter have a density higher than that of the other types of color filters, thereby realizing acquisition of highly accurate gradient information from a multiband color filter array.

13 Claims, 22 Drawing Sheets

| C1 | C2 | C1 | C7 | C1 | C2 | C1 | C7 |
| C3 | C10 | C4 | C10 | C3 | C10 | C4 | C10 |
| C1 | C8 | C1 | C9 | C1 | C8 | C1 | C9 |
| C5 | C10 | C6 | C10 | C5 | C10 | C6 | C10 |
| C1 | C2 | C1 | C7 | C1 | C2 | C1 | C7 |
| C3 | C10 | C4 | C10 | C3 | C10 | C4 | C10 |
| C1 | C8 | C1 | C9 | C1 | C8 | C1 | C9 |
| C5 | C10 | C6 | C10 | C5 | C10 | C6 | C10 | px

218a

COLOR FILTER ARRAY AND IMAGE SENSOR

CROSS-REFERENCE TO RELATED APPLICATION

The present application is a Continuing Application based on International Application PCT/JP2012/003069 filed on May 10, 2012, which, in turn, claims the priority from Japanese Patent Application No. 2011-106740 filed on May 11, 2011, the entire disclosure of which is incorporated herein by reference.

TECHNICAL FIELD

The present invention relates to color filter arrays and image sensors that realize improvement of color reproducibility and acquisition of the gradient information (differential information) used for various image processing at a high accuracy as well.

BACKGROUND OF THE INVENTION

There is known an imaging apparatus including an image sensor provided with a three-color (RGB) filter for capturing full-color images. It is known that the gradient information of images is acquired to detect various information from the captured images and to perform various processing of the images. In the conventional imaging apparatus, the number of bands of color filter is small, thus the sample density of image signal components corresponding to each band is relatively high, and the accuracy of the gradient information based on interpolation images produced by color interpolation is sufficiently high.

To provide a faithful color reproduction of an object, a multiband image photographing has received an attention. For multiband image photographing, photographing with a plurality of cameras or several times of photographing may be performed. However, for such a multiband image photographing, a dedicated photographing system has been needed. Thus, there has been suggested that, by using a single-chip multiband image sensor where color filters of four or more bands are arranged, a multiband image photographing is performed by one piece of photography with one imaging apparatus (see Patent Literature 1).

CITATION LIST

Patent Literature

Patent Literature 1: JP 2003087806A

SUMMARY OF THE INVENTION

In Patent Literature 1, a multiband color filter array (CFA) is used. However, as the number of bands increases, the sample density of a single band decreases. When the sample density of a single band decreases, acquisition of the gradient information in the common direction becomes difficult, resulting in complicated processing and reduction in accuracy of the gradient information such as, for example, missing of the high frequency component information due to conversion for matching the direction of the gradient information. Further, when bands having a high sample density are arranged, images with less degradation due to interpolation are obtained, and thus the image quality is improved, whereas the sample density of the other bands decreases. When the gradient information cannot be obtained from the band having a low sample density, as a result thereof, the accuracy of the gradient information is reduced. Reduction in the accuracy of the gradient information affects the subsequent processes, and may result in, for example, generation of false colors. Such a phenomenon is remarkable in the CFA in which seven or more pixels are used.

Thus, in view of the above-described problem, it is an object of the present invention to provide, with the CFA in which seven or more types of pixels are used and at least one type of the color filters are arranged with a density that is higher than that of the other color filters, in comparison with the CFA in which less than seven types of pixels are used, a CFA and an image sensor capable of generating RAW (mosaic) data that prevents decrease in accuracy of the obtainable gradient information.

In order to solve the above-described problem, the color filter array according to the present invention has seven or more types of color filters including a first color filter, the color filters having different spectral sensitivity characteristics, the color filters being arranged in a two dimensional form, wherein in a color filter of interest, which is at least two or more types of color filters among the seven or more types of color filters, two color filters arranged at a first interval on both sides of the color filter of interest along a first direction are of the same type, and two color filters arranged at a second interval on both sides of the color filter of interest along a second direction that is different from the first direction are of the same type; and among the color filters, at least one type of color filters have a density that is higher than that of the other types of color filters.

According to the color filter array and the image sensor according to the present invention configured in the above-mentioned manner, in the CFA in which seven or more types of pixels are used and at least one type of color filters are arranged with a density that is higher than that of the other color filters, in comparison with the CFA in which less than seven types of pixels are used, RAW (mosaic) data that prevents decrease in accuracy of the obtainable gradient information (differential information) can be generated.

DESCRIPTION OF EMBODIMENTS

Figure 1:
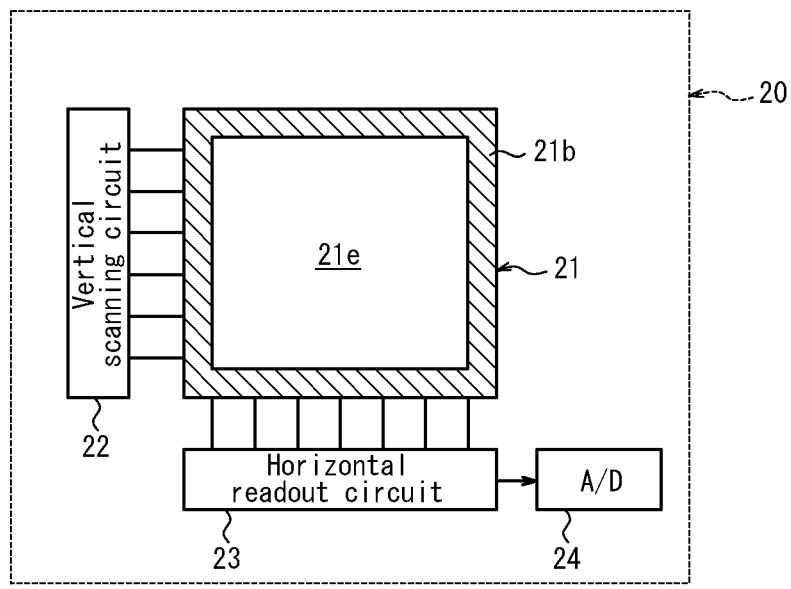
FIG. 1 is a block diagram showing a schematic configuration of an image sensor having a color filter array according to one embodiment of the present invention.

The embodiments that apply the present invention are described below with reference to the drawings. FIG. 1 is a block diagram showing a schematic configuration of an image sensor having color filter arrays according to one embodiment of the present invention.

The image sensor 20 is, for example, a CMOS area sensor, and comprises a light receiving unit 21, a vertical scanning circuit 22, a horizontal readout circuit 23 and an A/D converter 24. An optical image of the object is formed on the light receiving unit 21 by a photographic optical system (not shown).

On the light receiving unit 21, a plurality of pixels are arranged in a matrix pattern. Further, on the light receiving unit 21, an OB (optical black) area 21b and an effective photographed area 21e are defined. The light receiving surface of the OB pixels arranged on the OB area 21b is shielded, and the OB pixels output a dark current as an OB pixel signal, which is the base of black. Further, the effective photographed area 21e is covered by the CFA (not shown in FIG. 1), and each pixel is covered by any of seven-band color filters.

Figure 2:
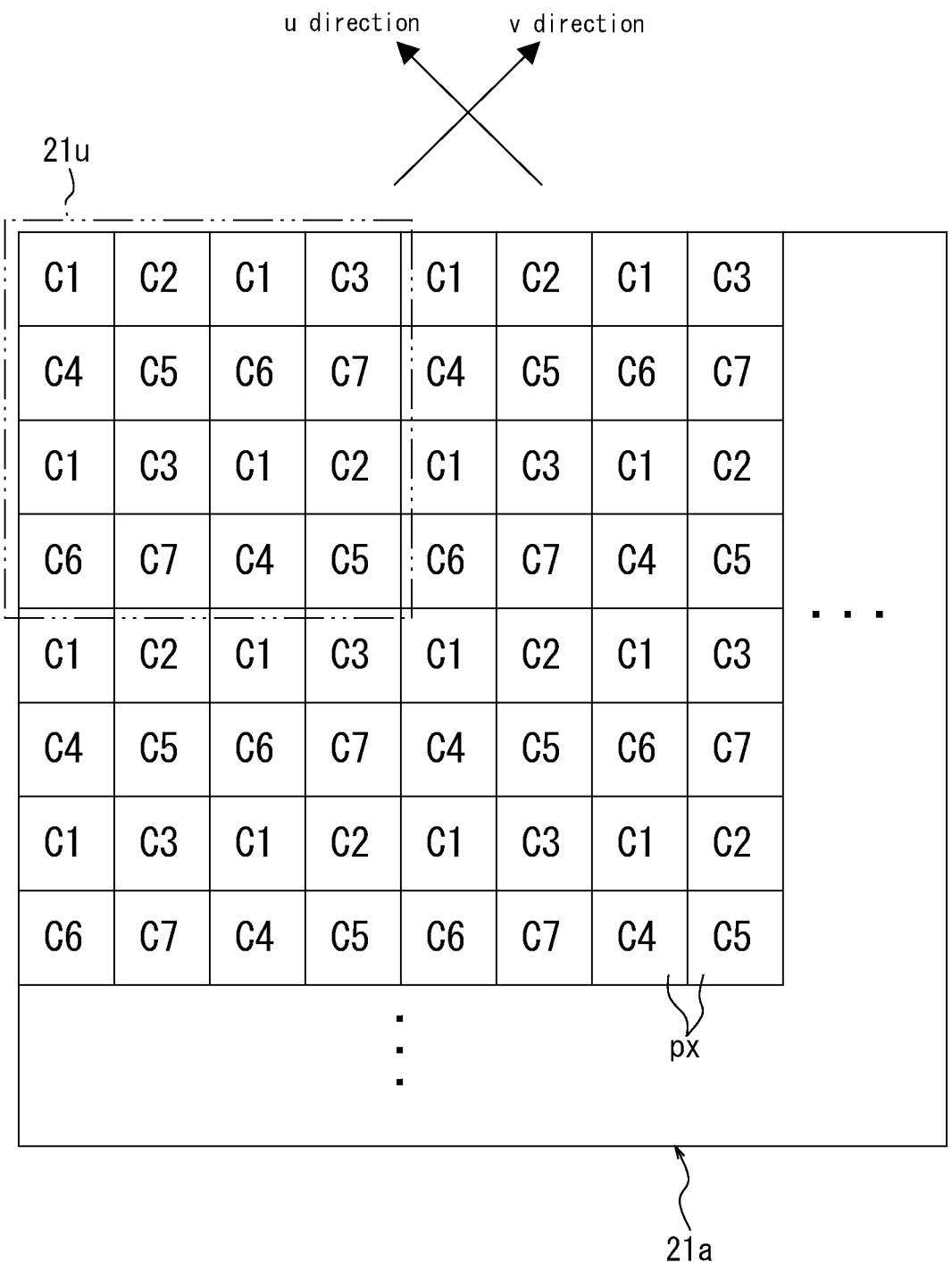
FIG. 2 is an array diagram showing an arrangement of color filters in the CFA.
Figure 3:
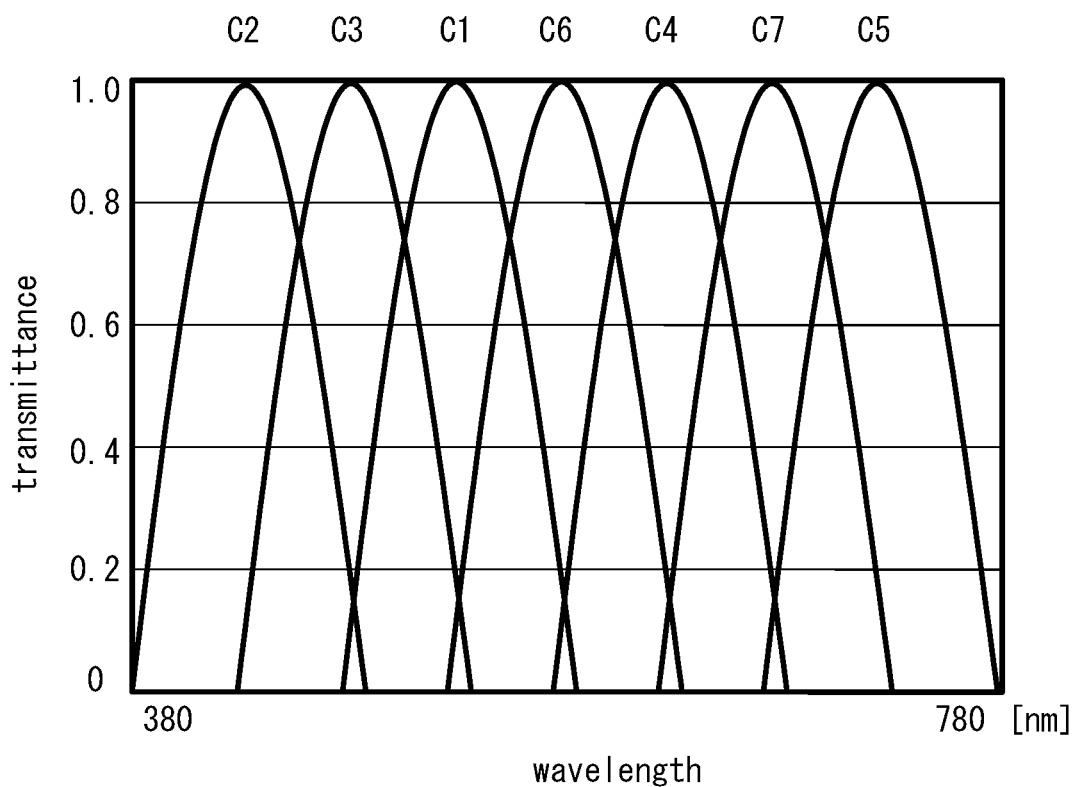
FIG. 3 is spectral sensitivity characteristics of the color filters in FIG. 2.

As shown in FIG. 2, CFA 21a is provided with seven-band color filters of C1~C7. Thus, in each pixel, a pixel signal according to the light reception amount of transmission band of corresponding color filter is generated. As shown in FIG. 3, C1~C7 color filters have spectral sensitivity characteristics different from each other. In this embodiment, different spectral sensitivity characteristics means different value of peak wavelength or different central value of full width at half maximum.

In CFA 21a, a color filter repeating unit 21u of 4×4 matrix is repeatedly arranged in the row direction and the column direction. As shown in FIG. 2, in the color filter repeating unit 21u, four C1 color filters and C2~C7 color filters, two each, are arranged.

In CFA 21a, C1 color filters are repeatedly arranged every other pixel over all rows and columns. For example, in the upper left unit in FIG. 2, on the first and third rows, C1 color filter is arranged on the first and third columns.

A row of C1, C2 and C3 color filters is repeatedly arranged every other pixel in the column direction, and a row of C4, C5, C6 and C7 color filters is repeatedly arranged every other pixel in the column direction.

Further, a column of C1, C4 and C6 color filters is repeatedly arranged every other pixel in the row direction, and a column of C2, C3, C5 and C7 color filters is arranged every other pixel in the row direction.

In the above-described color filter repeating unit 21u, C1 color filters account for the largest percentage, which is 25% of all color filters. Further, with respect to a pixel on an arbitrary position, the color filters corresponding to the pixels diagonally adjacent thereto are of the same band.

For example, as shown in FIG. 2, color filters diagonally adjacent to every C1 color filter are all C5 or C7 color filters. Thus C5 color filters are respectively arranged on diagonally upper right and diagonally lower left of any C1 color filter, and these C5 color filters are of the same band. Further, C7 color filters are respectively arranged on diagonally lower right and diagonally upper left of any C1 color filter, and these C7 color filters are of the same band.

In addition, every C2 color filter is diagonally sandwiched between C4 color filters or C6 color filters. More specifically, C4 color filters are respectively arranged on diagonally upper right and diagonally lower left of any C2 color filter and these C4 color filters are of the same band. Further, C6 color filters are respectively arranged on diagonally lower right and diagonally upper left, and these C6 color filters are of the same band.

The same applies to C3 to C7 color filters, and the color filters diagonally adjacent thereto are of the same band.

In pixels provided with the above-described CFA 21a, pixel signals according to the reception amount of the light that transmits the band are generated. The row of pixel that outputs a pixel signal is selected by the vertical scanning circuit 22, and the column of pixel that outputs a pixel signal is selected by the horizontal readout circuit 23 (see FIG. 1). The vertical scanning circuit 22 and the horizontal readout circuit 23 are controlled so that a pixel signal is output one pixel by one pixel. The pixel signals that have been output are converted into digital signals by the A/D converter 24.

In the CFA according to the first embodiment configured in the above-described manner, although the CFA has color filters (pixels) of seven or more bands, at least two types of color filters of them are sandwiched, with respect to the common first direction and the second direction perpendicular to the first direction, between the color filters of the same type that are arranged at a predetermined interval on both sides of each of the two types of color filters. Thus, by using color signals (pixel signals) of at least the color filters of the same type, the gradient information of the first direction and the second direction can be obtained. That is, RAW (mosaic) data that prevents reduction in the accuracy of obtainable gradient information (differential information) can be generated.

Generally, in natural images, it is known that correlation between bands is strong in high frequency components. Therefore an image of each band has the same edge structure, and thus it is assumed that all bands have the same gradient information. Therefore, the accuracy sufficient for the subsequent image processing and the like can be obtained from differential values of any color signal components. As in the case of this embodiment, in an arrangement where the correlation between two colors from which a differential value is obtained is high, more accurate information can be obtained.

When colors having a sample density higher than that of the other color filters are arranged on one-quarter or half of the checkerboard, the colors of two directions from which differential values are obtained will be the same. Thus more accurate information can be obtained. In this embodiment, for example, pixels diagonally adjacent to C5 and C7 color filters are all C1 color filters.

Further, in all pixels, differential values in the common direction are obtained, thereby, in comparison with the case where differential values are obtained in a direction which is different with respect to each pixel, process can be simplified. In addition, with such a configuration, highly accurate gradient information resulting from reduction in missing of information on high frequency components due to conversion for matching the directions of the gradient information can be obtained.

When the highly accurate gradient information is used for interpolation of the missing color signal component, generation of false color can be reduced. Further, when the highly accurate gradient information is used, highly accurate noise reduction processing, conversion from multiband into RGB, color conversion processing and color/gamma correction processing can be performed.

The present invention is described based on the drawings and embodiments. It should be noted that the person skilled in the art may easily make various modifications and changes. Therefore it should be understood that all of such modifications and changes are included in the scope of present invention.

For example, in the above-described embodiment, an arrangement of seven-band color filters is defined. However, the same effect as that of this embodiment can be obtained if the color filters are arranged such that an arbitrary pixel is diagonally sandwiched between the color filters of the same type.

Figure 4:
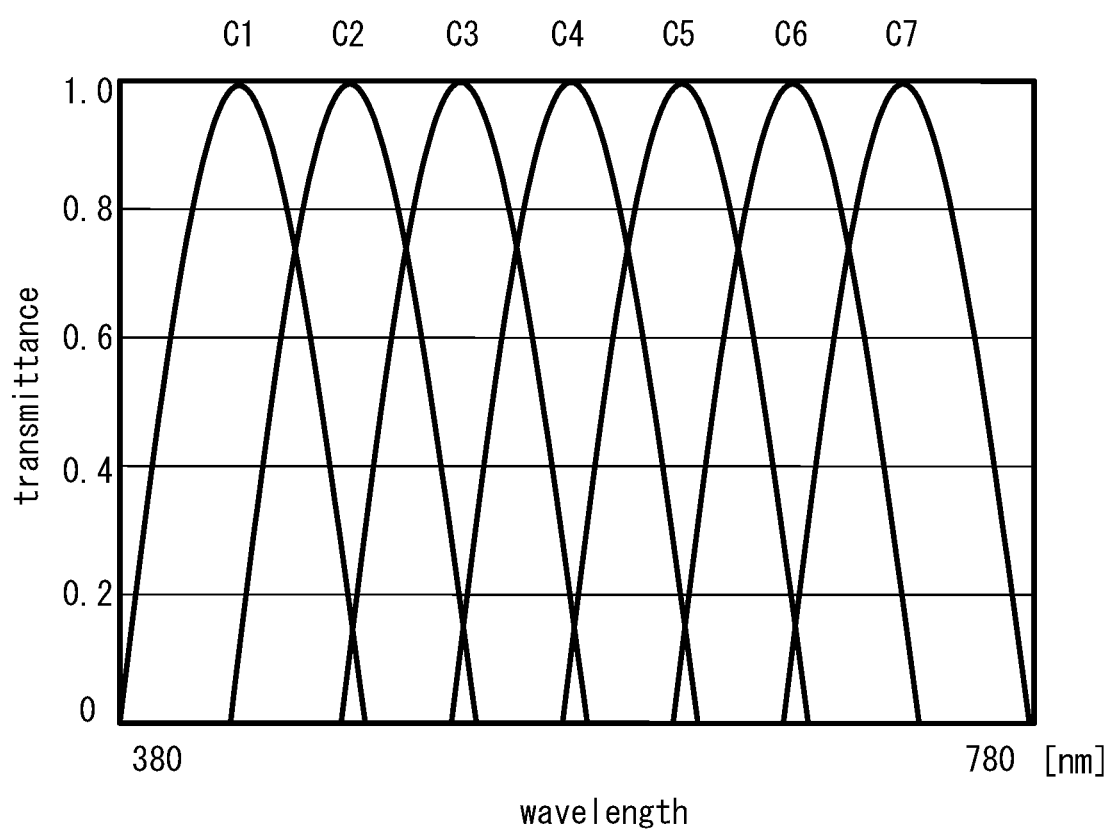
FIG. 4 is spectral sensitivity characteristics of color filters in the CFA according to a first modification.
Figure 5:
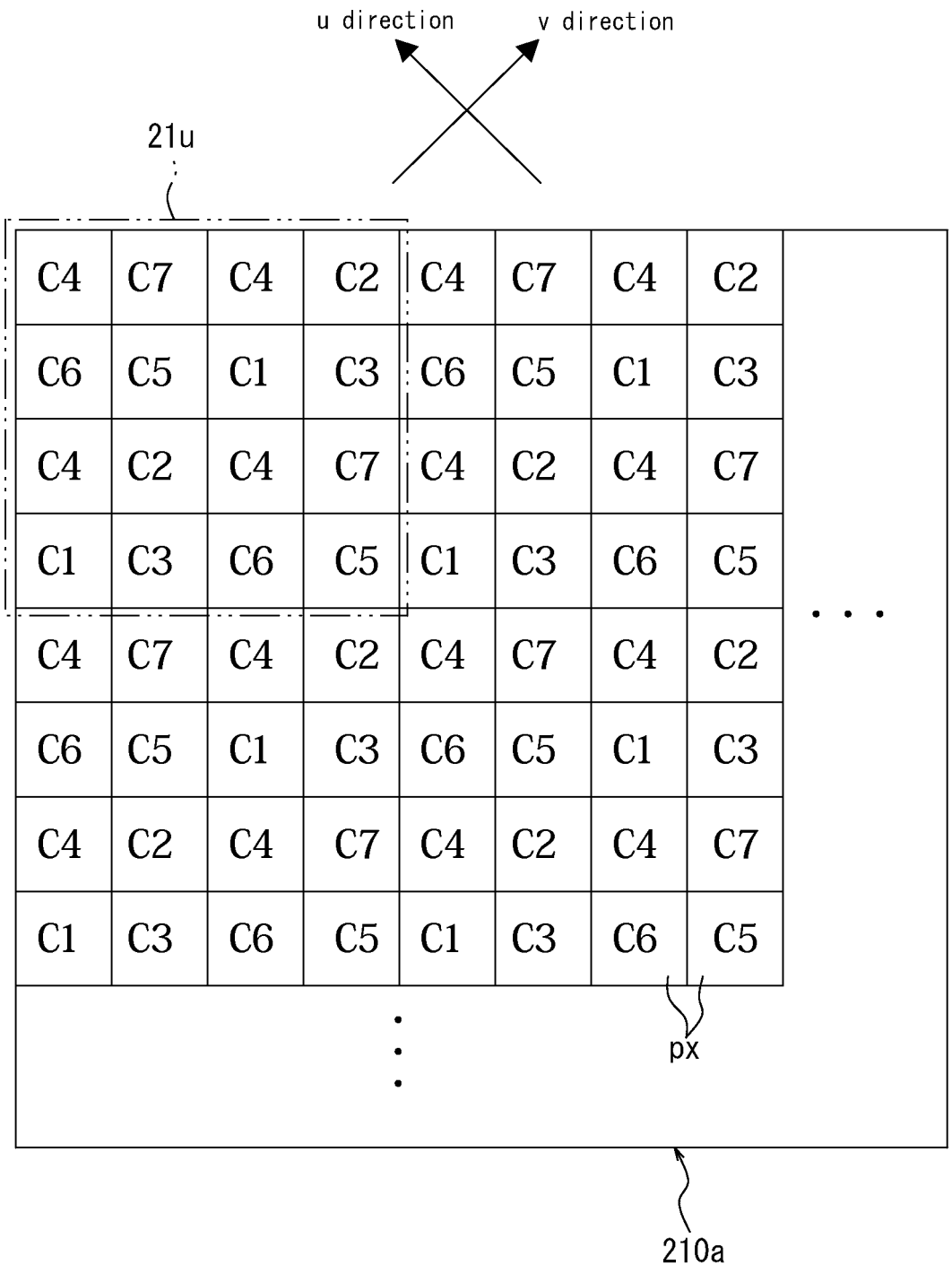
FIG. 5 is an array diagram showing an arrangement of color filters in the CFA according to the first modification.

For example, even in the case of CFA210a shown in FIG. 5 where C1 to C7 color filters having spectral sensitivity shown in FIG. 4 are employed, the same effect as that of this embodiment can be obtained. In the example shown in FIG. 5, whatever pixel is designated as a pixel of interest, pixels used for calculation of differential value always contain a highly related color. That is, for example, C7 color filter is always arranged diagonally to C6 color filter. As such, a highly related color is contained when a differential value is calculated, and thus more highly accurate calculation of differential value can be realized.

Further, in this embodiment, although the same type of two pixels arranged on both sides of a pixel of interest are adjacent to the pixel of interest, these two pixels are not necessarily adjacent thereto if each of them is arranged at an equal interval. For example, the pixel arranged two pixels right and two pixels up from the pixel of interest and the pixel arranged two pixels left and two pixels down therefrom may be of the same type.

An arrangement of the pixels of the same type in the common direction from the pixel adjacent to the pixel of interest over all pixels is limited to the case where seven types of color filters are used. However, when the pixels of the same type are arranged at an equal interval from the pixel of interest, the type of color filter may be increased.

Thus, even if the color filters of two pixels adjacent to the pixel of interest are of different type, when color filters are arranged such that the color filters of two pixels arranged at an equal interval from the pixel of interest are of the same type, the same effect as that of this embodiment can be obtained.

Further, in this embodiment, both in u and v directions, the pixels of the same type are arranged at an interval of one pixel from the pixel of interest. However, the interval of u direction may be different from that of v direction. A differential value can be calculated by dividing by the length according to the interval.

In this embodiment, the pixels of the same type are arranged in u and v directions of the pixel of interest. However, the direction of arranging the pixels of the same type is not limited to u and v. With the color filter array in which the pixels of the same type are arranged in two directions different from each other, the same effect as that of this embodiment can be obtained.

For example, in CFA21a according to this embodiment, whatever pixel is designated as a pixel of interest, the color filters of two pixels arranged at an interval of two pixels on both sides of the pixel of interest along the row direction are of the same type, and the color filters of two pixels at an interval of two pixels on both sides of the pixel of interest along the column direction are also of the same type.

Moreover, in this embodiment, although the pixels of the same type are arranged in two directions, the direction of arranging the pixels of the same type is not limited to two directions. In any pixel, the same effect as that of this embodiment can be obtained with the color filter array in which the pixels of the same type are arranged in at least two types of common direction.

For example, in CFA21a according to this embodiment, whatever pixel is designated as a pixel of interest, the color filters of two pixels arranged at an interval of two pixels on both sides of the pixel of interest along the row direction are of the same type. Further, in CFA21a according to this embodiment, the color filters of two pixels at an interval of two pixels on both sides of the pixel of interest along the column direction are also of the same type. Moreover, in CFA21a according to this embodiment, the color filters of two pixels at an interval of two pixels on both sides of the pixel of interest along u direction are of the same type, and in CFA21a according to this embodiment, the color filters of two pixels at an interval of two pixels on both sides of the pixel of interest along v direction are also of the same type. With a configuration in which a differential value is calculated based on pixel signals of two pixels arranged respectively at an interval of two pixels in four directions, the same effect as that of this embodiment can be obtained. When the direction of obtaining a differential value is increased, more accurate differential information can be obtained.

Figure 6:
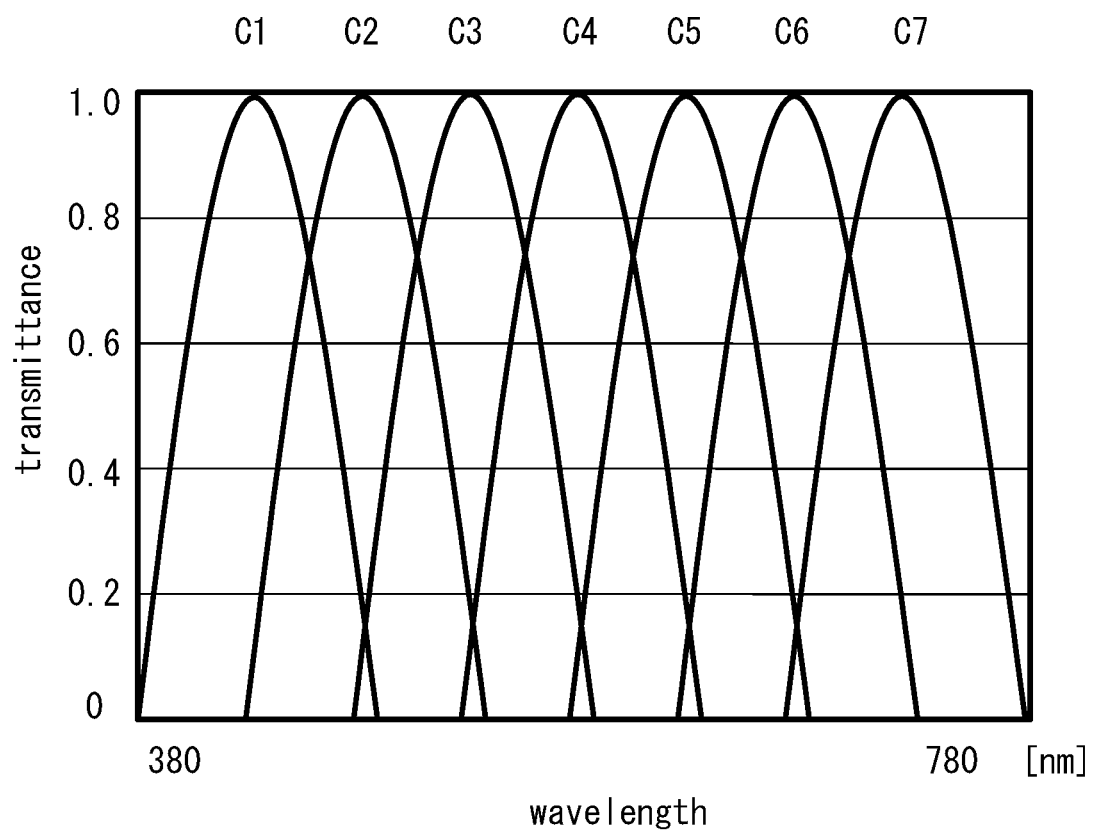
FIG. 6 is spectral sensitivity characteristics of color filters in the CFA according to a second modification.
Figure 7:
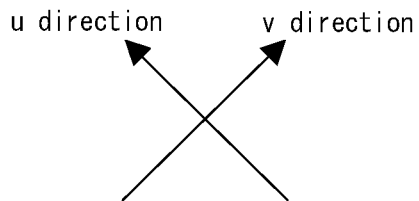
FIG. 7 is an array diagram showing an arrangement of color filters in the CFA according to the second modification.

Further, an interval between pixels of the same type may differ depending on the type of pixel. For example, in CFA211a shown in FIG. 7 where C1 to C7 color filters having spectral sensitivity shown in FIG. 6 are employed, in the case of C4 color filter, the color filters of four pixels arranged at an interval of two pixels on both sides of the pixel of interest along the row and column directions are of the same type. Further, for six types of color filters excepting C4 color filters, the color filters of four pixels arranged at an interval of one pixel on both sides of the pixel of interest along the row and column directions are of the same type.

A differential value in two directions can be obtained from at least one pixel of two pixels adjacent in column or row direction, and thus highly accurate differential information can be obtained. With a configuration in which a differential value is calculated at a pixel interval depending on the type of pixel, the same effect as that of this embodiment can be obtained.

Further, at least only two types of color filters may be sandwiched between the color filters of the same type. For example, in CFA211a of FIG. 7, with respect to C1, C2, C4, C6 and C7 color filters, the color filters of two pixels diagonally arranged at an interval of one pixel are of the same type. With respect to C1 color filter, the color filters arranged diagonally upper right and lower left are C3 color filters, and color filters arranged diagonally upper left and lower right are C5 color filters. If at least two types of color filters are sandwiched between the color filters of the same type, even if the accuracy decreases in comparison with the differential value calculated from all pixels, a differential value which is accurate enough for the subsequent image processing and the like can be obtained.

Figure 8:
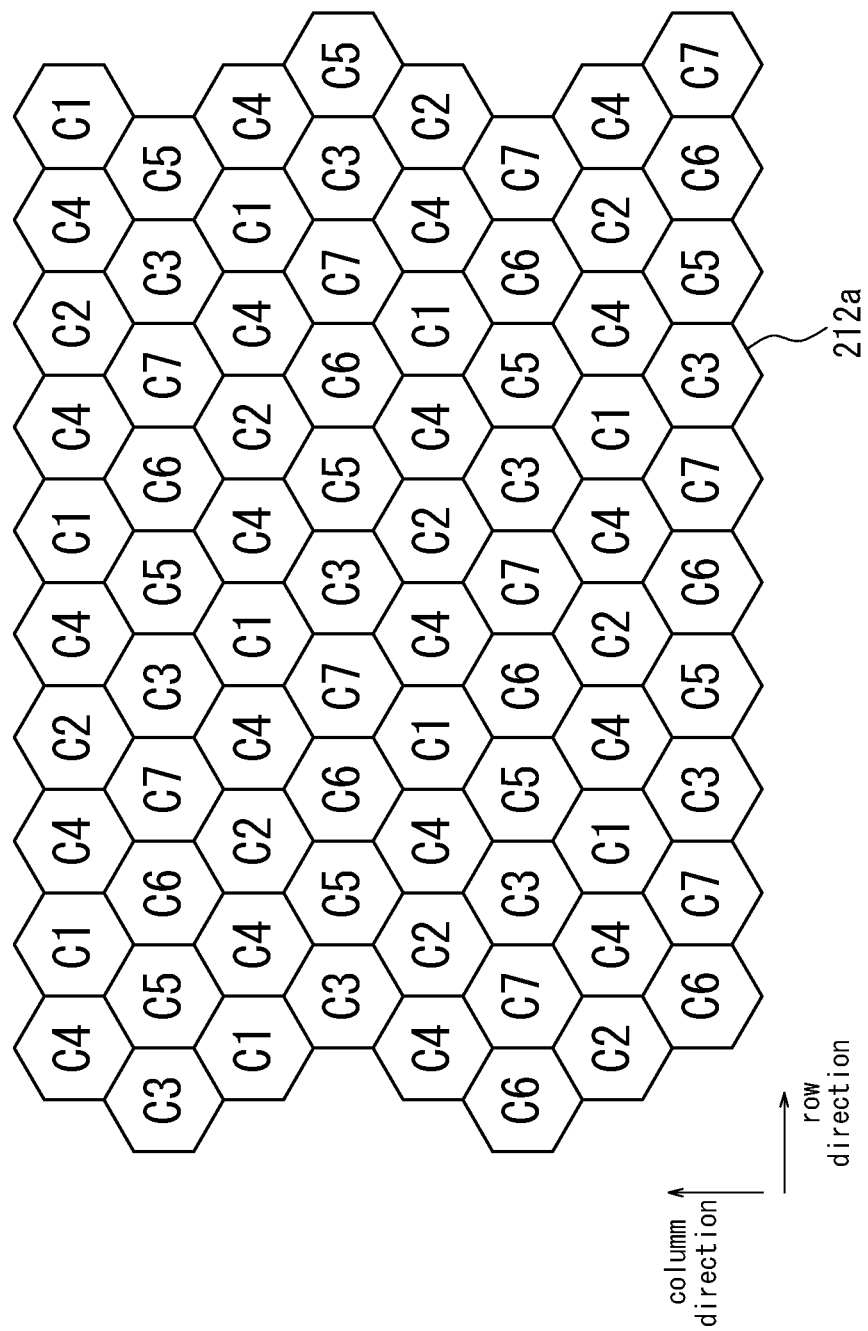
FIG. 8 is an array diagram showing an arrangement of color filters in the CFA according to a third modification.

In addition, with respect to the image sensor in a honeycomb structure as shown in FIG. 8, the same effect as that of the first embodiment can be obtained. In CFA212a shown in FIG. 8, whatever pixel is designated as a pixel of interest, the color filters of two pixels arranged at an interval of two pixels on both sides of the pixel of interest along the direction of 60° from the row direction are of the same type, and the color filters of two pixels arranged at an interval of two pixels on both sides of the pixel of interest along the direction of 30° from the column direction are also of the same type.

Figure 9:
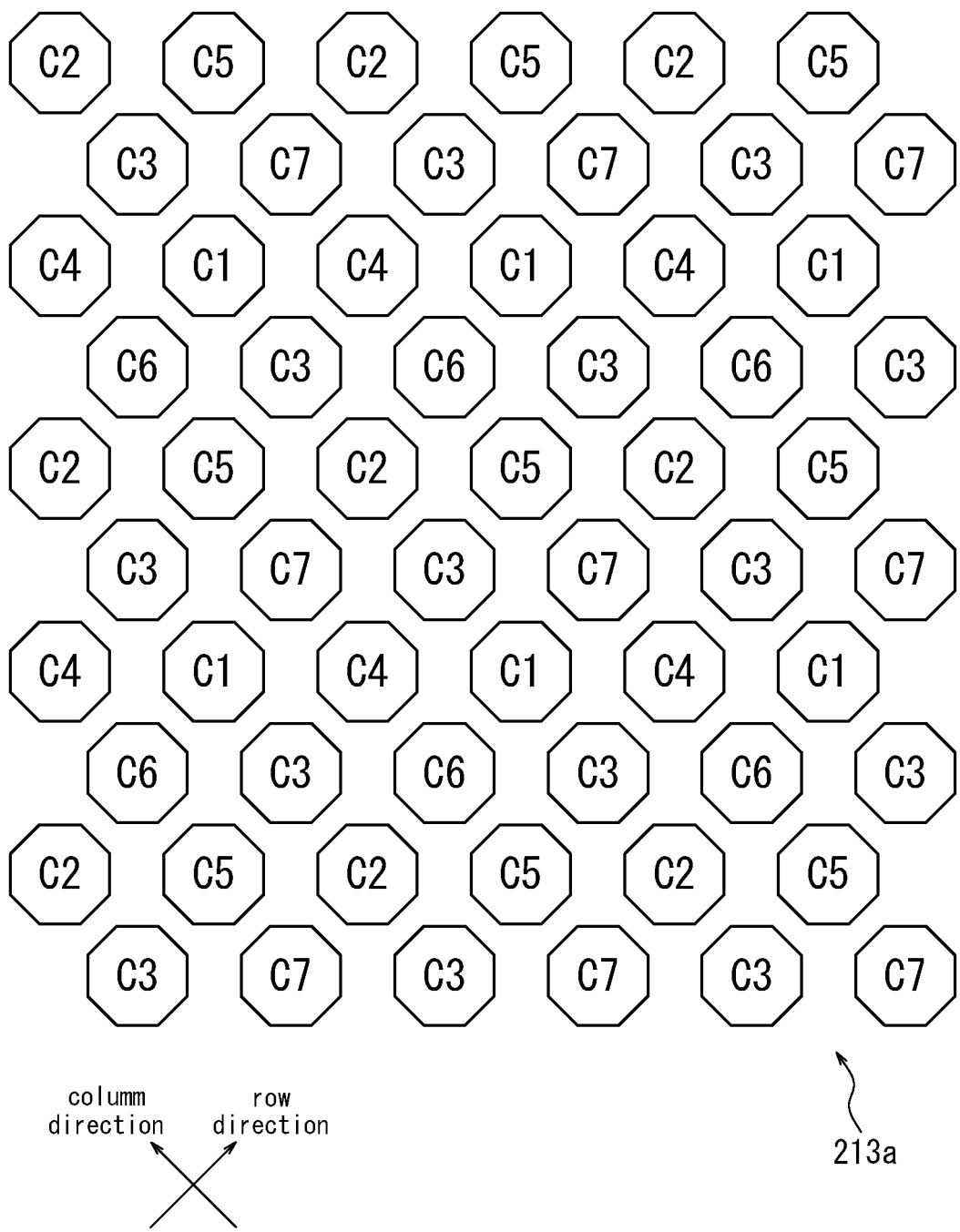
FIG. 9 is an array diagram showing an arrangement of color filters in the CFA according to a fourth modification.

Further, as shown in FIG. 9, with respect to the image sensor in which each pixel arranged in a matrix pattern is inclined at 45°, the same effect as that of the first embodiment can be obtained. In CFA213a shown in FIG. 9, whatever pixel is designated as a pixel of interest, the color filters of two pixels arranged on both sides of the pixel of interest along respectively the column and row directions are of the same type.

Figure 10:
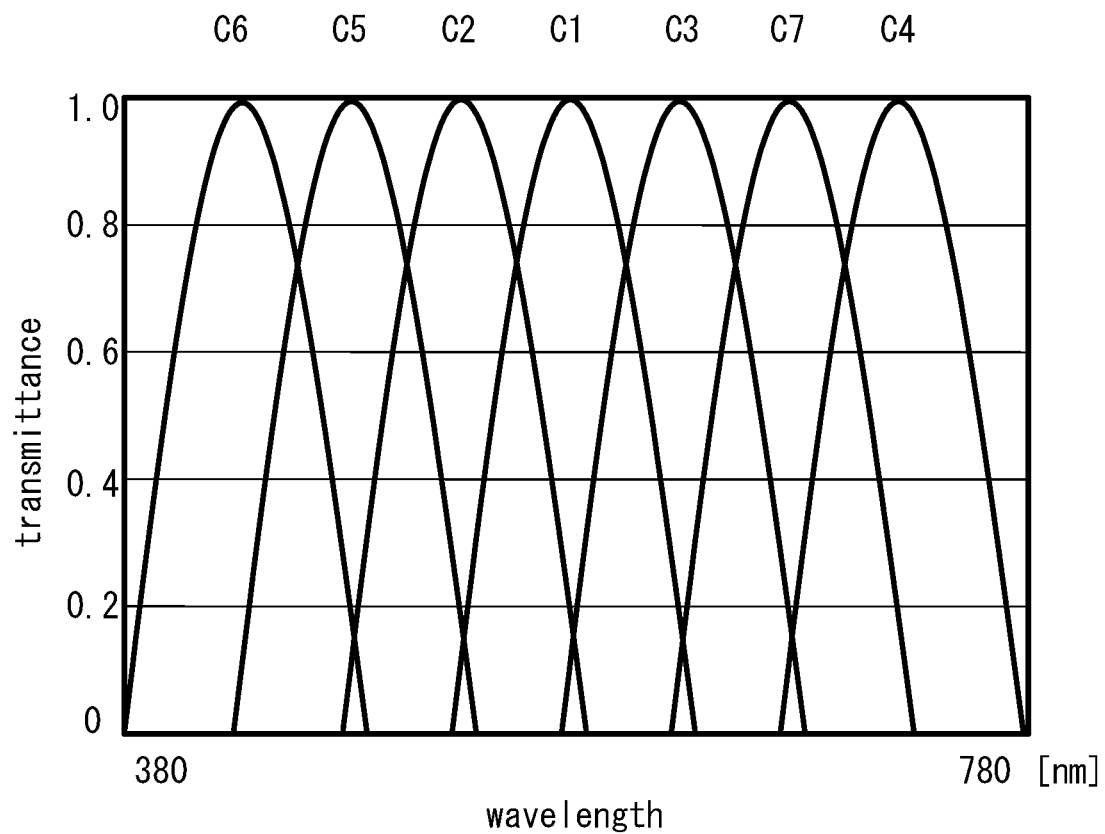
FIG. 10 is spectral sensitivity characteristics of color filters in the CFA according to a fifth modification.
Figure 11:
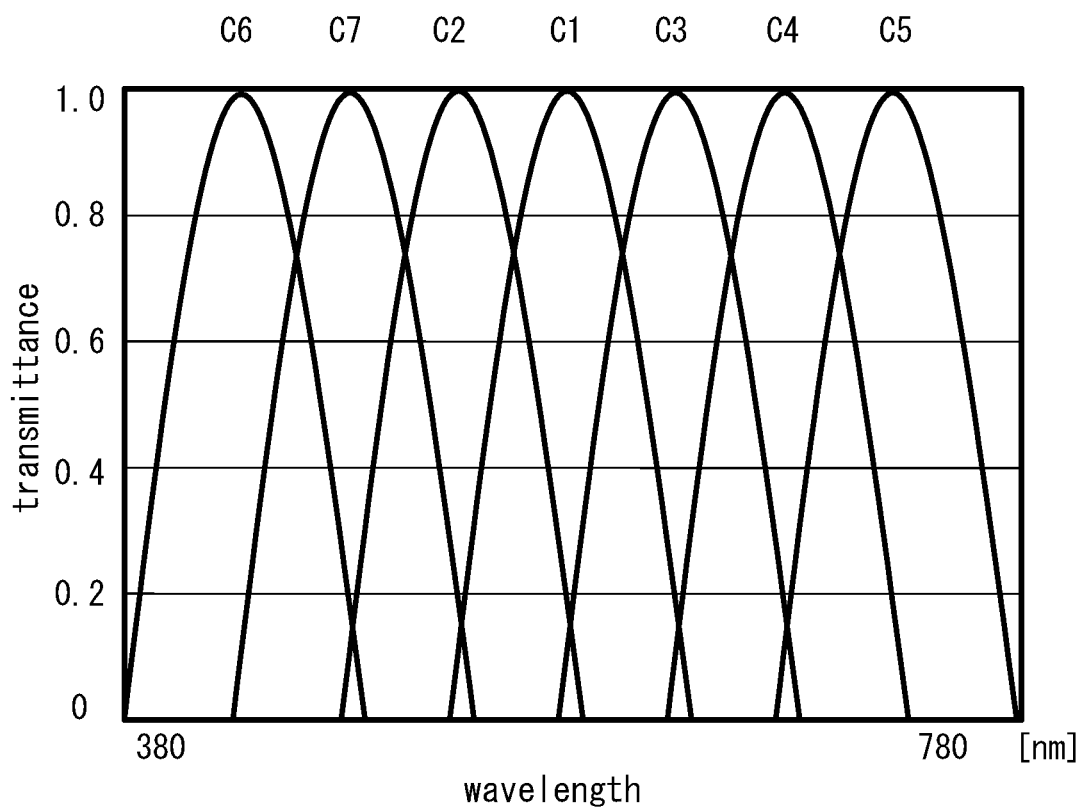
FIG. 11 is spectral sensitivity characteristics of color filters in the CFA according to a sixth modification.
Figure 12:
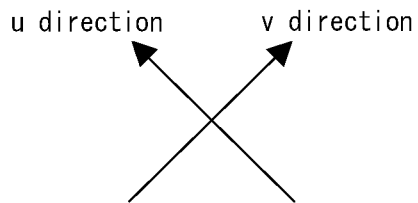
FIG. 12 is an array diagram showing an arrangement of color filters in the CFA according to the fifth modification.
Figure 13:
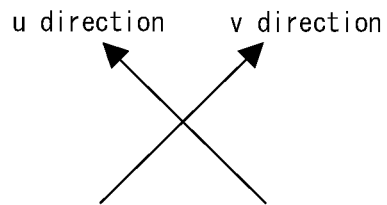
FIG. 13 is an array diagram showing an arrangement of color filters in the CFA according to the sixth modification.

Moreover, in CFA214a and 215a shown in FIGS. 12 and 13 respectively employing C1 to C7 color filters having spectral sensitivity shown in FIGS. 10 and 11, with respect to any pixel px, the color filters of two pixels arranged at an interval of two pixels respectively in u and v directions are of the same type.

Further, in this embodiment, seven-band color filters are provided in CFA21a. However, color filters of eight or more bands may be provided.

Figure 14:
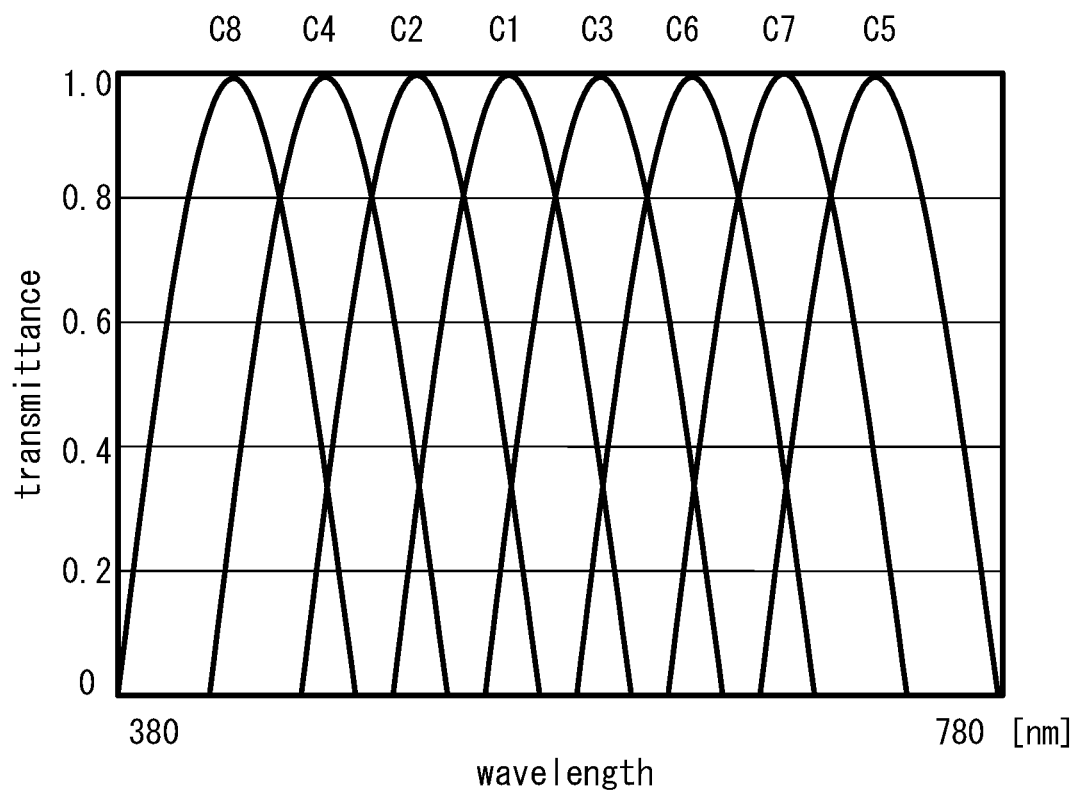
FIG. 14 is spectral sensitivity characteristics of color filters in the CFA according to a seventh modification.
Figure 15:
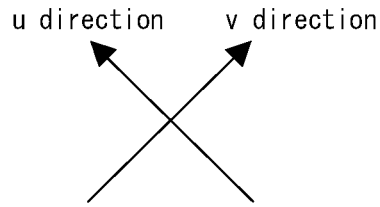
FIG. 15 is an array diagram showing an arrangement of color filters in the CFA according to the seventh modification.

Moreover, in CFA216a shown in FIG. 15 employing C1 to C8 color filters having the spectral sensitivity shown in FIG. 14, in any pixel px, the color filters of pixels px arranged at an interval of two pixels in u and v directions are of the same type.

Figure 16:
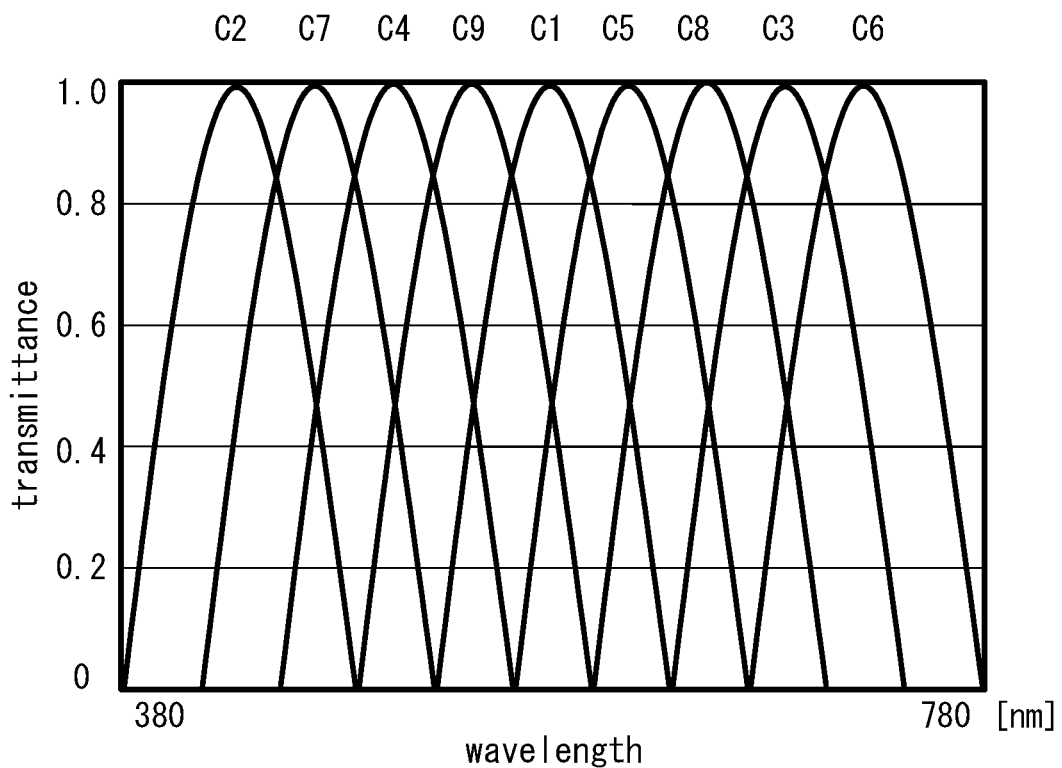
FIG. 16 is spectral sensitivity characteristics of color filters in the CFA according to an eighth modification.
Figure 17:
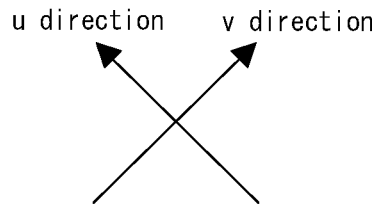
FIG. 17 is an array diagram showing an arrangement of color filters in the CFA according to the eighth modification.

Further, in CFA217a shown in FIG. 17 employing C1 to C9 color filters having the spectral sensitivity shown in FIG. 16, in any pixel px, the color filters of pixels px arranged at an interval of two pixels in u and v directions are of the same type.

Figure 18:
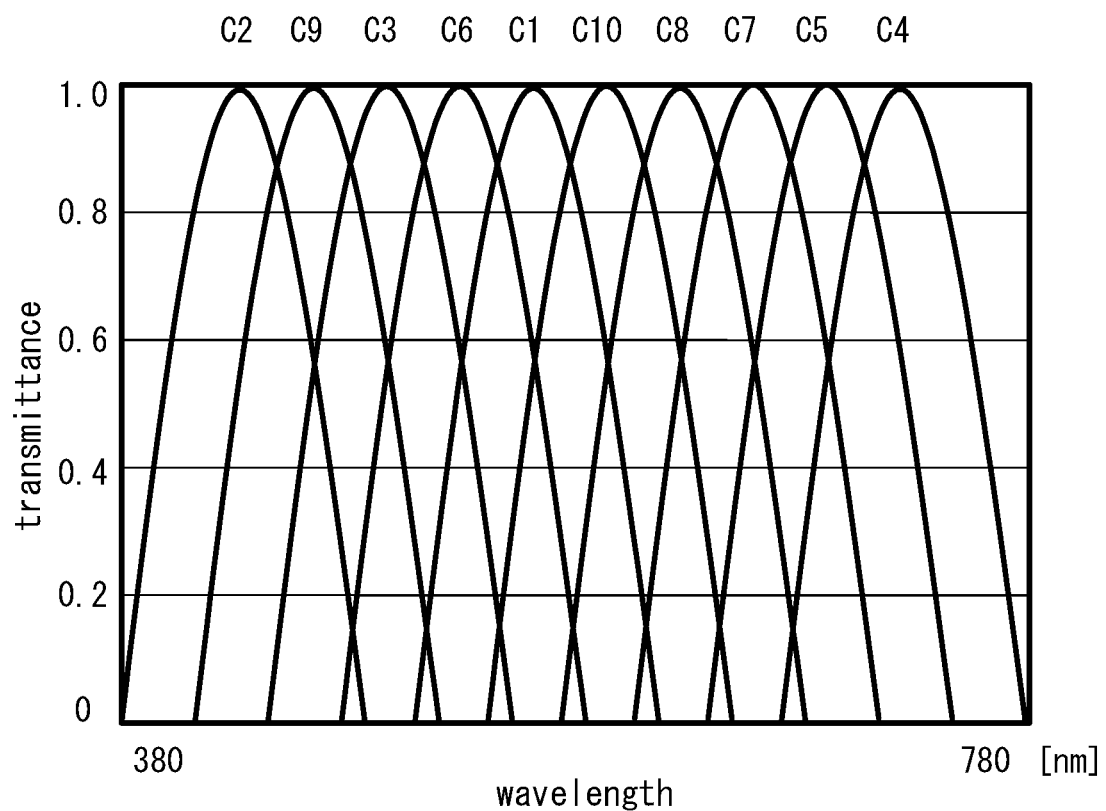
FIG. 18 is spectral sensitivity characteristics of color filters in the CFA according to a ninth modification.
Figure 19:
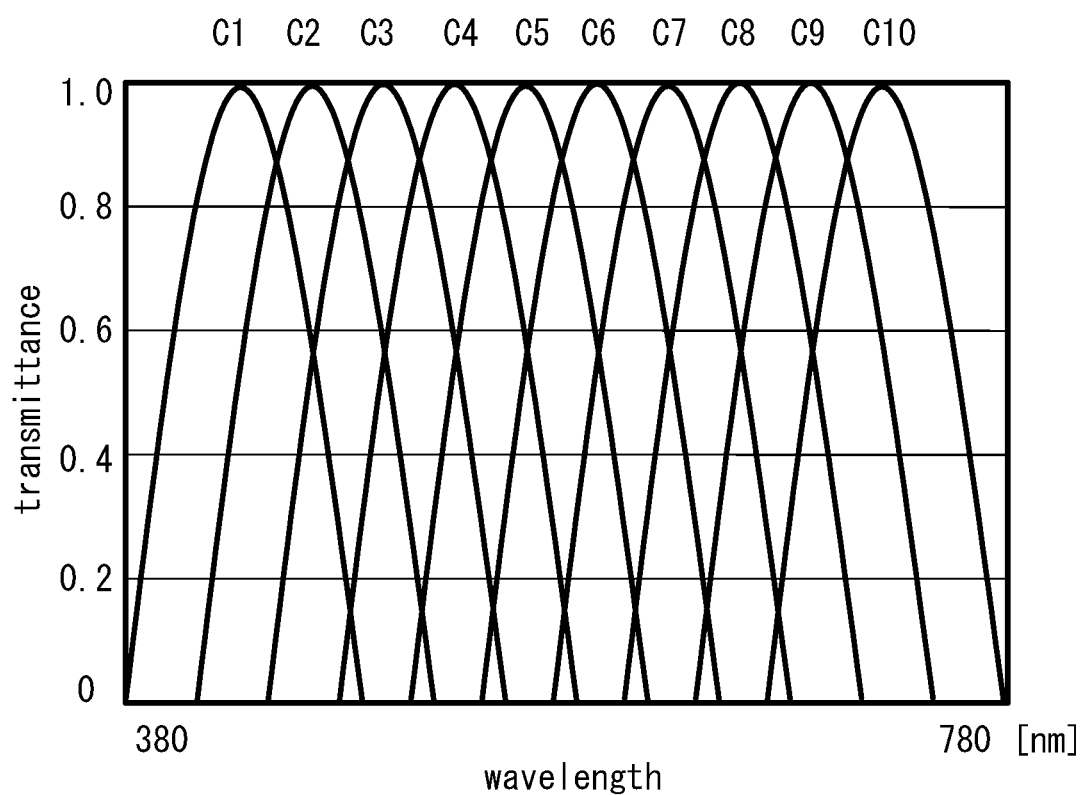
FIG. 19 is spectral sensitivity characteristics of color filters in the CFA according to a tenth modification.
Figure 20:
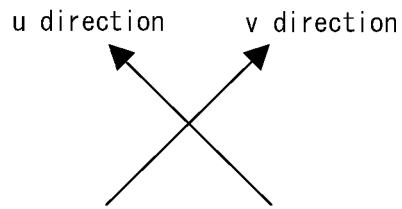
FIG. 20 is an array diagram showing an arrangement of color filters in the CFA according to the ninth modification.
Figure 21:
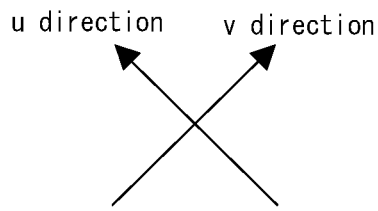
FIG. 21 is an array diagram showing an arrangement of color filters in the CFA according to the tenth modification.

Moreover, for example, in CFA218a and 219a shown in FIGS. 20 and 21 employing C1 to C10 color filters having the spectral sensitivity shown in FIGS. 18 and 19, in any pixel px, the color filters of pixels px arranged at an interval of two pixels in u and v directions are of the same type.

Figure 22:
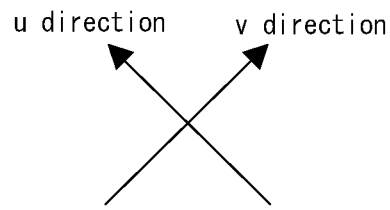
FIG. 22 is an array diagram showing an arrangement of color filters in the CFA according to an eleventh modification.

Further, in CFA2100a shown in FIG. 22 where 13 band color filters of C1 to C13 are arranged, in any pixel px, the color filters of pixels px arranged at an interval of two pixels in u and v directions are of the same type.

REFERENCE SIGNS LIST 20 image sensor
21a, 211a, 212a, 213a, 214a, 215a, 216a, 217a, 218a, 219a, 2100a color filter array (CFA)

The invention claimed is:

1. A color filter array comprising seven or more types of color filters including a first color filter, the color filters having different spectral sensitivity characteristics, the color filters being arranged in a two dimensional form, wherein
in a color filter of interest, which is at least two or more types of color filters among the seven or more types of color filters, two of the color filters arranged at a first interval on both sides of the color filter of interest along a first direction are of the same type, and two of the color filters arranged at a second interval on both sides of the color filter of interest along a second direction which is different from the first direction are of the same type; and
among the color filters, at least one type of color filters have a density higher than that of the other types of color filters.

2. The color filter array according to claim 1, wherein the first interval and the second interval are equal.

3. The color filter array according to claim 2, wherein the color filter is of seven types and the first interval and the second interval are respectively of one pixel.

4. The color filter array according to claim 1, wherein
the color filter is arranged in a matrix pattern; and
angles between the first direction and a row direction and between the second direction and the row direction are respectively 45°, and angles between the first direction and a column direction and between the second direction and the column direction are respectively 45°.

5. The color filter array according to claim 1, wherein the color filters are arranged in a matrix pattern, and the first direction corresponds to the row direction and the second direction corresponds to the column direction.

6. The color filter array according to claim 1, wherein
among the at least two types of color filters arranged as the color filters of interest, two types of color filters are adjacent to each other; and
only in the pixel covered by one of the two types of color filters adjacent to each other, the first interval and the second interval are respectively of one pixel.

7. The color filter array according to claim 1, wherein
the color filters are arranged in a matrix pattern, and
the first color filters are, taking an arbitrary pixel as a reference pixel, from the reference pixel, arranged every other pixel over all rows and columns respectively along a row direction and a column direction.

8. The color filter array according to claim 1, wherein
the color filters are arranged in a matrix pattern; and
the first color filters are arranged in a check pattern.

9. The color filter array according to claim 1, wherein the color filters except for the first color filters are arranged in the same proportion.

10. The color filter array according to claim 1, wherein
a peak wavelength of spectral sensitivity characteristics of two color filters of the same type arranged at the first interval on both sides of the color filter of interest along the first direction is adjacent to a peak wavelength of spectral sensitivity characteristics of the color filter of interest.

11. The color filter array according to claim 1, wherein a peak wavelength of spectral sensitivity characteristics of two color filters of the same type arranged at the first interval on both sides of the color filter of interest along the first direction is adjacent to a peak wavelength of spectral sensitivity characteristics of two color filters of the same type arranged at the second interval on both sides of the color filter of interest along the second direction.

12. The color filter array according to claim 1, wherein
two of the color filters arranged at a third interval on both sides of the color filter of interest along a third direction that equally divides an angle between the first direction and the second direction are of the same type; and
two of the color filters arranged at a fourth interval on both sides of the color filter of interest along a fourth direction perpendicular to the third direction are of the same type.

13. An image sensor comprising a color filter array according to claim 1.

* * * * *